US008582306B2

(12) United States Patent
Hamand et al.

(10) Patent No.: US 8,582,306 B2
(45) Date of Patent: Nov. 12, 2013

(54) MODULAR COMPONENT CHASSIS COUPLING SYSTEM

(75) Inventors: Karl I. Hamand, Round Rock, TX (US); Keith D. Webb, Liberty Hill, TX (US); Todd E. Lewis, Corvallis, OR (US); Zachary A. Cravens, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 387 days.

(21) Appl. No.: 13/094,317

(22) Filed: Apr. 26, 2011

(65) Prior Publication Data

US 2012/0275104 A1 Nov. 1, 2012

(51) Int. Cl.
*H05K 7/16* (2006.01)
*H05K 5/00* (2006.01)
*A47B 81/00* (2006.01)
*H01R 13/62* (2006.01)

(52) U.S. Cl.
USPC ........ 361/727; 361/726; 361/732; 312/223.1; 312/223.2; 439/160

(58) Field of Classification Search
USPC ............. 361/679.01–679.45, 679.55–679.59, 361/724–727, 732; 312/223.1, 223.2; 211/26; 439/160, 157, 153, 353, 352, 439/354, 358
See application file for complete search history.

(56) References Cited

U.S. PATENT DOCUMENTS

| | | | |
|---|---|---|---|
| 4,597,173 A | 7/1986 | Chino et al. | |
| 5,520,069 A * | 5/1996 | Rynders et al. | 74/520 |
| 5,673,171 A * | 9/1997 | Varghese et al. | 361/679.34 |
| 5,793,614 A * | 8/1998 | Tollbom | 361/732 |
| 6,252,514 B1 * | 6/2001 | Nolan et al. | 340/686.4 |
| 6,762,934 B2 | 7/2004 | Kitchen et al. | |
| 6,956,745 B2 * | 10/2005 | Kerrigan et al. | 361/726 |
| 7,125,272 B1 * | 10/2006 | Liang | 439/160 |
| 7,576,979 B1 | 8/2009 | Dearborn et al. | |
| 8,054,638 B2 * | 11/2011 | Graybill et al. | 361/747 |
| 2008/0101040 A1 | 5/2008 | Tang | |

* cited by examiner

*Primary Examiner* — Jayprakash N Gandhi
*Assistant Examiner* — Nidhi Desai
(74) *Attorney, Agent, or Firm* — Haynes and Boone, LLP

(57) ABSTRACT

A modular component chassis coupling system includes a chassis having a first component coupling feature and a second component coupling feature located on opposite sides of a housing. A modular component includes a first chassis coupling feature and a second chassis coupling feature. A first handle is coupled to the first chassis coupling feature that is operable to engage the first component coupling feature to move the first handle into a coupling position and, once in the coupling position, the first handle is moved into a securing position to secure the modular component in the housing. A second handle is coupled to the second chassis coupling feature and is operable to engage the second component coupling feature to move the second handle into a coupling position and, once in the coupling position, the second handle is moved into a securing position to secure the modular component in the housing.

14 Claims, 19 Drawing Sheets

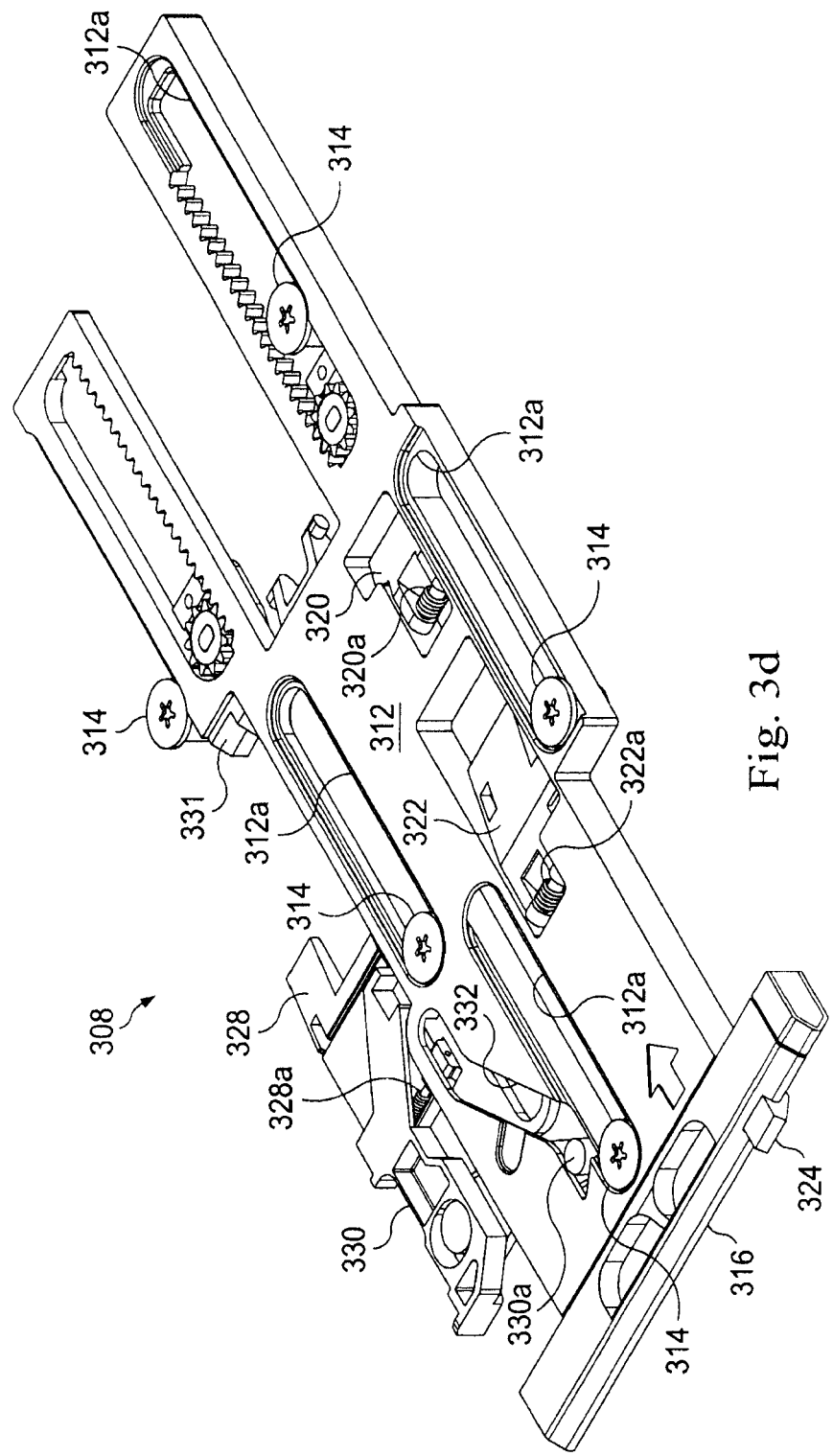

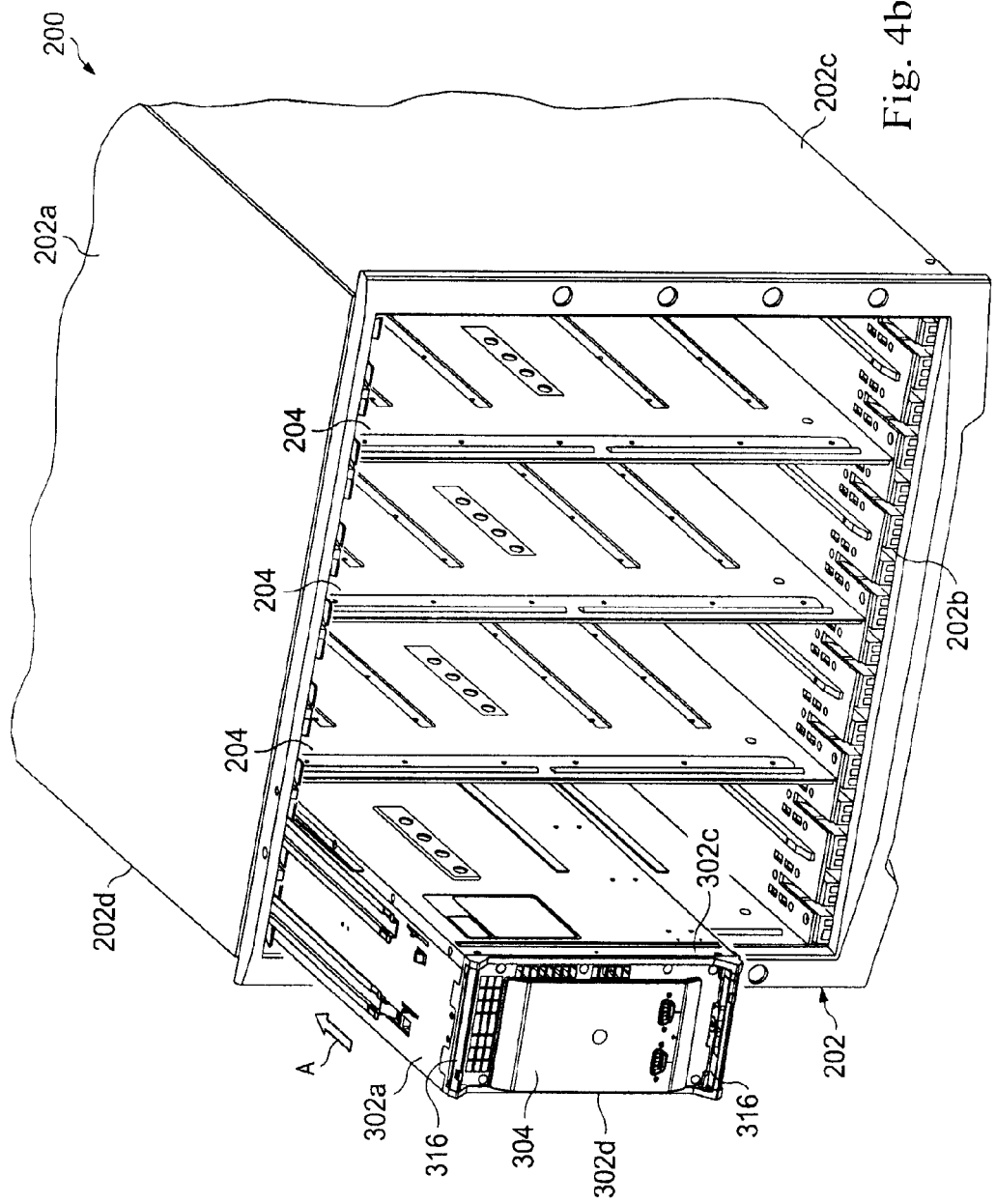

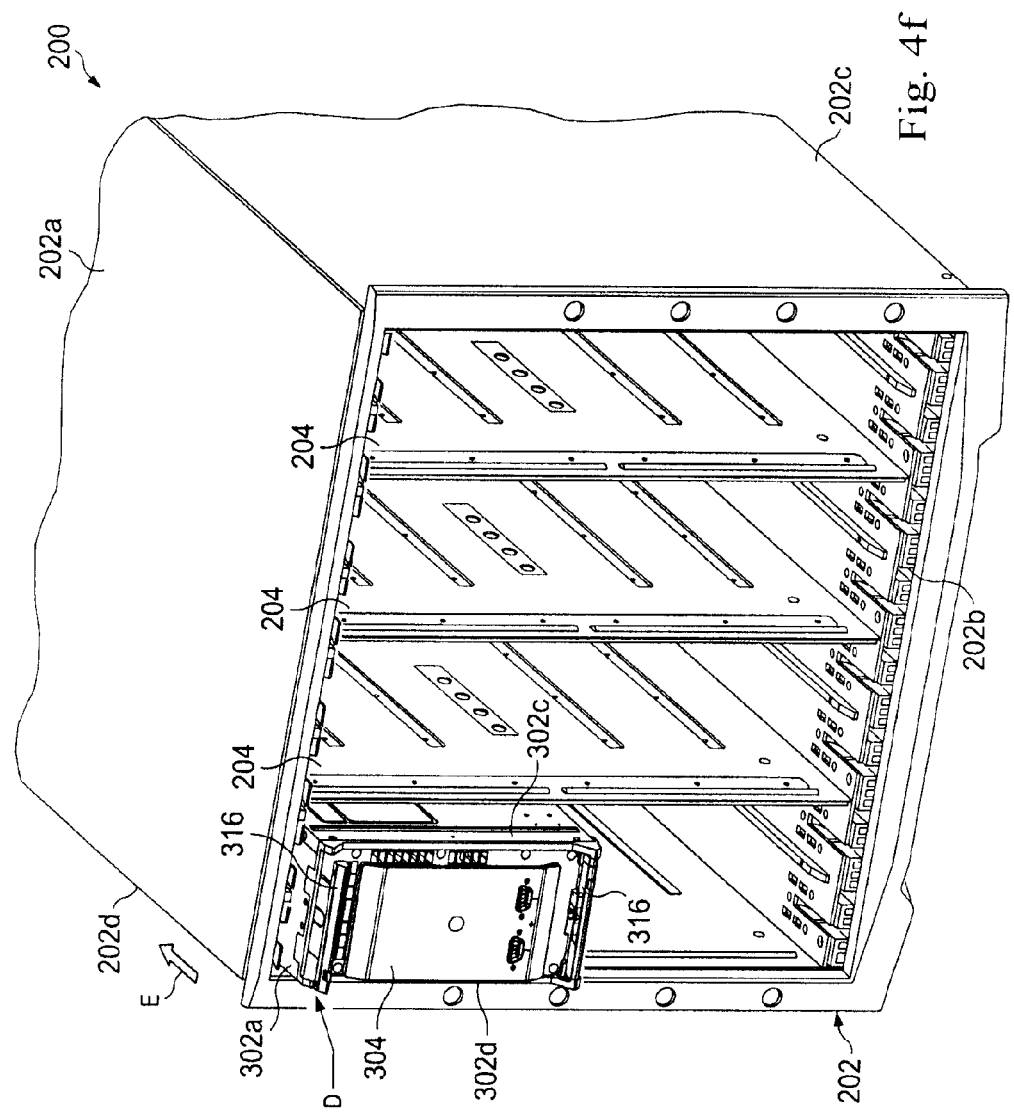

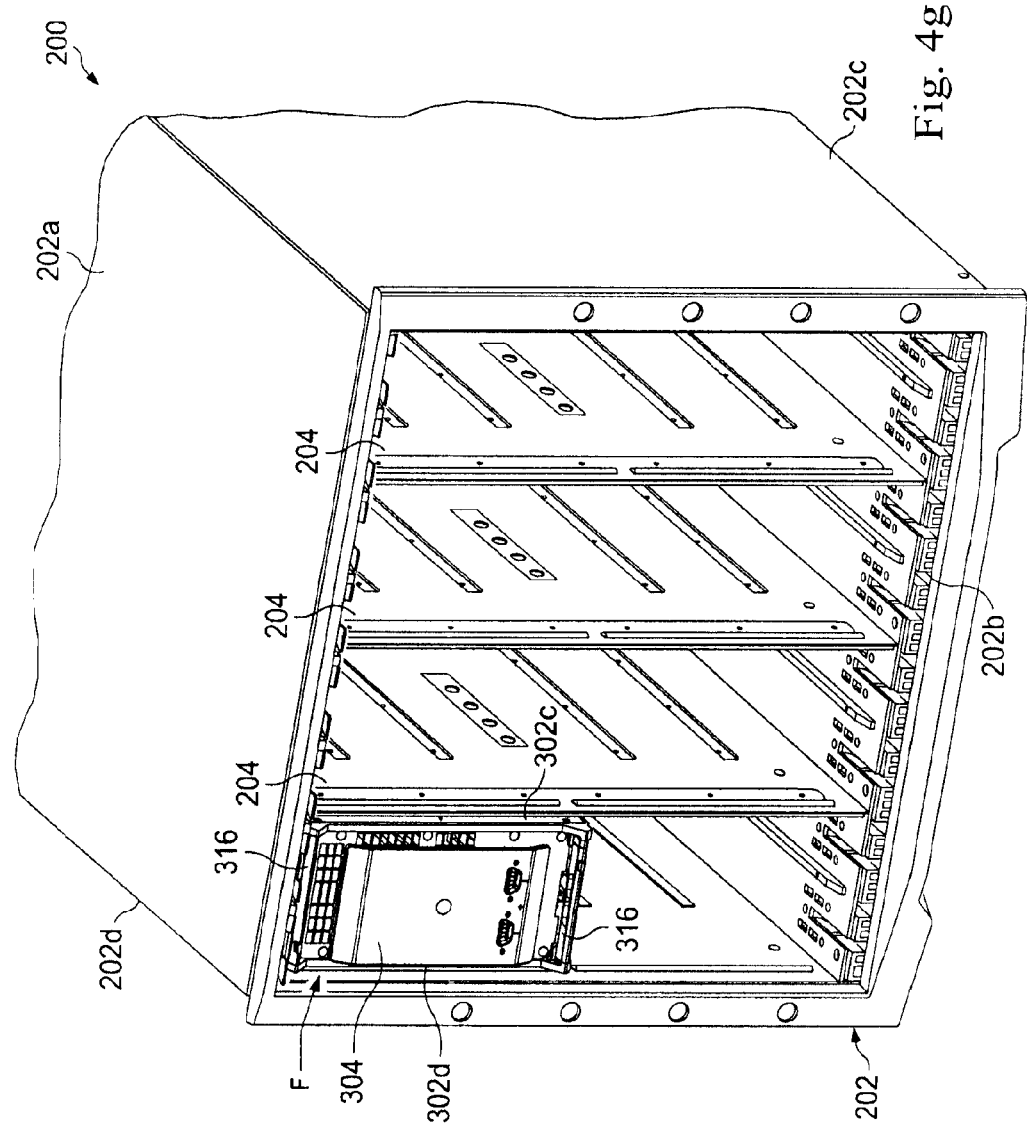

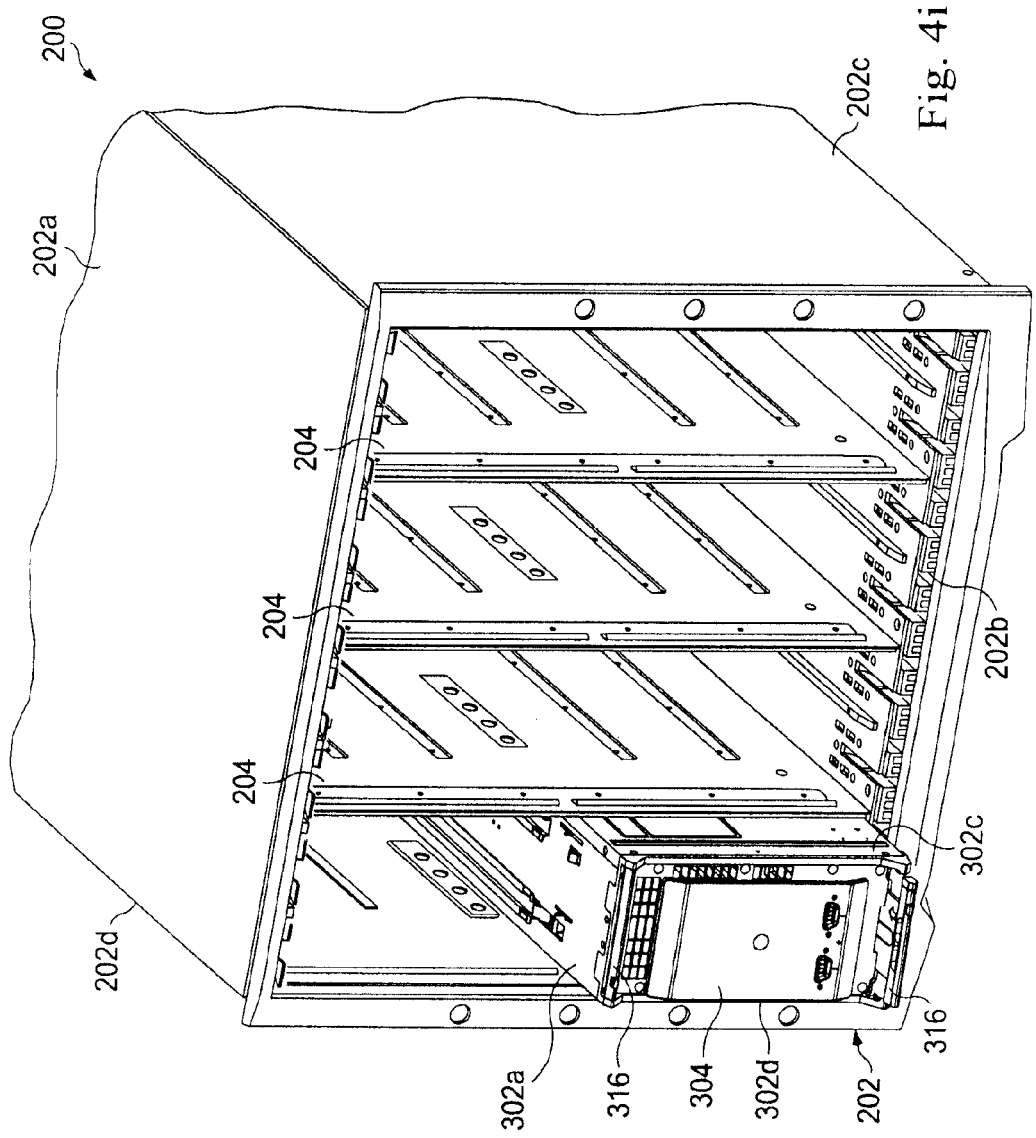

MODULAR COMPONENT CHASSIS COUPLING SYSTEM

BACKGROUND

The present disclosure relates generally to information handling systems (IHSs), and more particularly to coupling modular IHS components to a chassis.

As the value and use of information continues to increase, individuals and businesses seek additional ways to process and store information. One option is an IHS. An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Some IHSs include modular components that are coupled to a chassis using mechanical assistance to overcome relatively large forces that are needed to mate data and power connectors on each of the modular components and the chassis. These chassis may include multiple housings at different locations on the chassis and with different boundaries in which the modular component may be positioned in and coupled to the chassis, and the modular component may then require multiple chassis coupling features in order to allow it to be coupled to the chassis in the different housings. Conventional designs of such coupling devices have included a handle that spans a length of the modular component and that is coupled to each of the multiple coupling devices. When either of the coupling devices on such a conventional modular component engages the chassis, the handle is actuated to present it to the user so that the user may then actuate the handle to overcome the forces needed to mate the data and power connectors on the modular component and the chassis. However, as chassis get smaller, room on the modular component for the handle to span a length of the modular component has disappeared, which raises issues with the ability to couple the modular component to a chassis in differently located housings defined by the chassis having different boundaries.

Accordingly, it would be desirable to provide an improved modular component chassis coupling system.

SUMMARY

According to one embodiment, a modular component chassis coupling system includes a chassis defining a housing and including a first component coupling feature located adjacent a first component section in the housing and a second component coupling feature located adjacent a second component section in the housing; a modular component having a first side including a first chassis coupling feature and a second side having a second chassis coupling feature; a first handle coupled to the first chassis coupling feature, wherein in response to the modular component being positioned in the first component section, the first chassis coupling feature engages the first component coupling feature to move the first handle relative to the modular component and into a coupling position, and wherein the first handle is operable, once in the coupling position, to be moved into a securing position to secure the modular component in the first component section; and a second handle coupled to the second chassis coupling feature, wherein in response to the modular component being positioned in the second component section, the second chassis coupling feature engages the second component coupling feature to move the second handle relative to the modular component and into a coupling position, and wherein the second handle is operable, once in the coupling position, to be moved into a securing position to secure the modular component in the second component section.

BRIEF DESCRIPTION OF THE DRAWINGS

FIG. 2b is a perspective view illustrating an embodiment of a component coupling feature on the chassis of FIG. 2a.

FIG. 2c is a perspective view illustrating an embodiment of the chassis of FIG. 2a.

FIG. 3b is a perspective view illustrating an embodiment of a chassis coupling feature on the IHS component of FIG. 3a.

FIG. 3c is a perspective view illustrating an embodiment of a chassis coupling feature on the IHS component of FIG. 3a.

FIG. 3d is a perspective view illustrating an embodiment of the chassis coupling feature of FIGS. 3b and 3c.

FIG. 4b is a perspective view illustrating an embodiment of the IHS component of FIGS. 3a, 3b, 3c, and 3d positioned in a second component section defined by the chassis of FIGS. 2a, 2b, 2c, and 2d.

FIG. 4f is a perspective view illustrating the IHS component of FIG. 4b positioned in the chassis with a handle located in a coupling position.

FIG. 4g is a perspective view illustrating the IHS component of FIG. 4b positioned in the chassis with a handle located in a securing position.

FIG. 4i is a perspective view illustrating an embodiment of the IHS component of FIGS. 3a, 3b, 3c, and 3d positioned in a first component section defined by the chassis of FIGS. 2a, 2b, 2c, and 2d.

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a display device or monitor, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
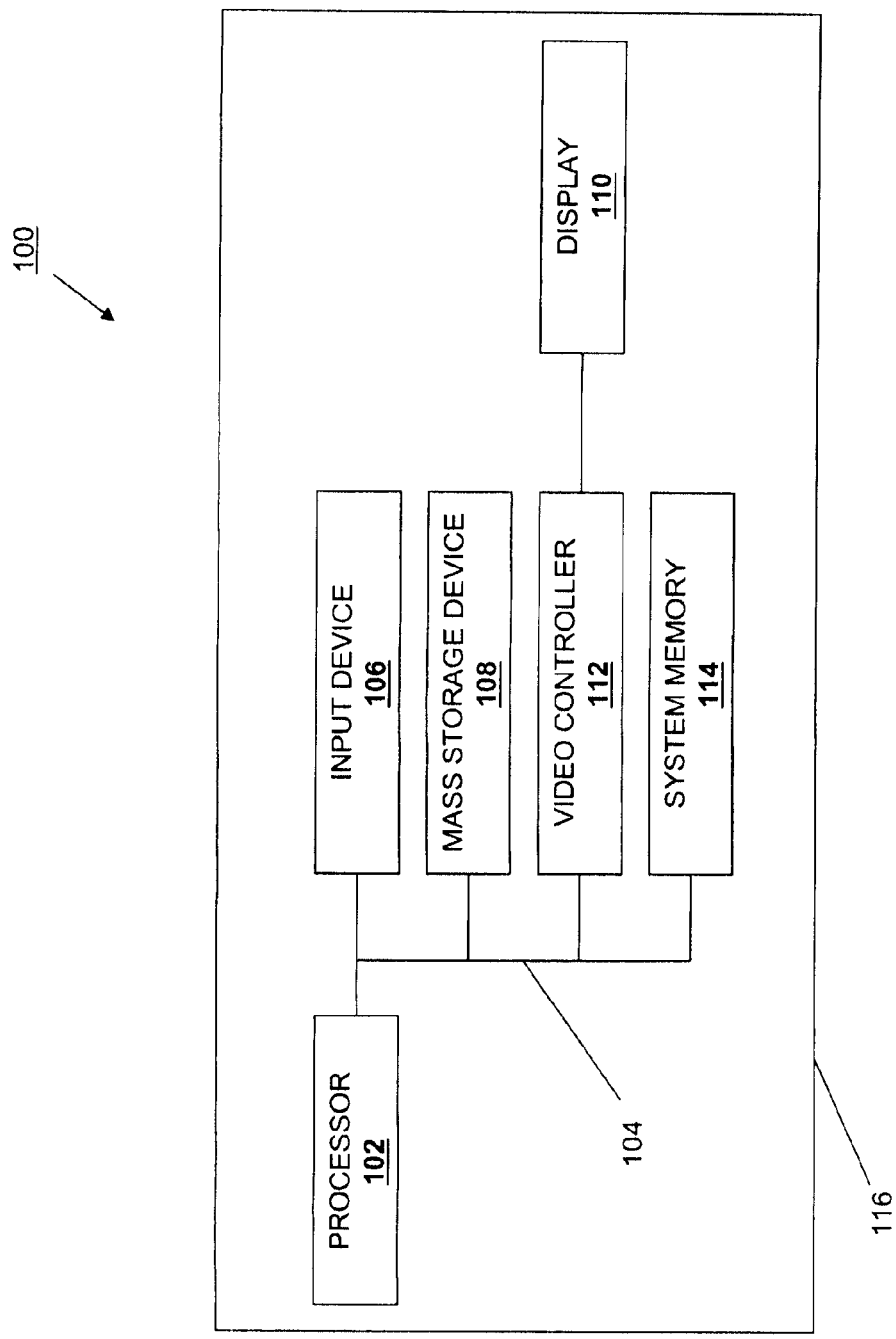
FIG. 1 is a schematic view illustrating an embodiment of an information handling system (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Referring now to FIGS. 2*a*, 2*b*, 2*c*, and 2*d*, a chassis 200 is illustrated. The chassis 200 includes a base 202 having a top wall 202*a*, a bottom wall 202*b* located opposite the base from the top wall 202*a*, and a pair of spaced-apart side walls 202*c* and 202*d* extending between the top wall 202*a* and the bottom wall 202*b*. A plurality of interior walls 204 extend between the top wall 202*a* and the bottom 202*b* in a spaced apart orientation from each other and the side walls 202*c* and 202*d* to define a plurality of housings 206. In the illustrated embodiment, each of the housings 206 include a first component section 206*a* and a second component section 206*b*. At least one IHS connector (not illustrated) is located on the chassis 200 adjacent each of the first component section 206*a* and the second component section 206*b* in each housing 206, and one of skill in art will recognize that, while not illustrated, a variety of IHS connectors in a variety of positions in the housings 206 will fall within the scope of the present disclosure. In an embodiment, the at least one IHS connector may include power connectors, data connectors, and/or a variety of other connectors know in the art, and may be coupled to other IHSs or components known in the art.

Figure 2A:
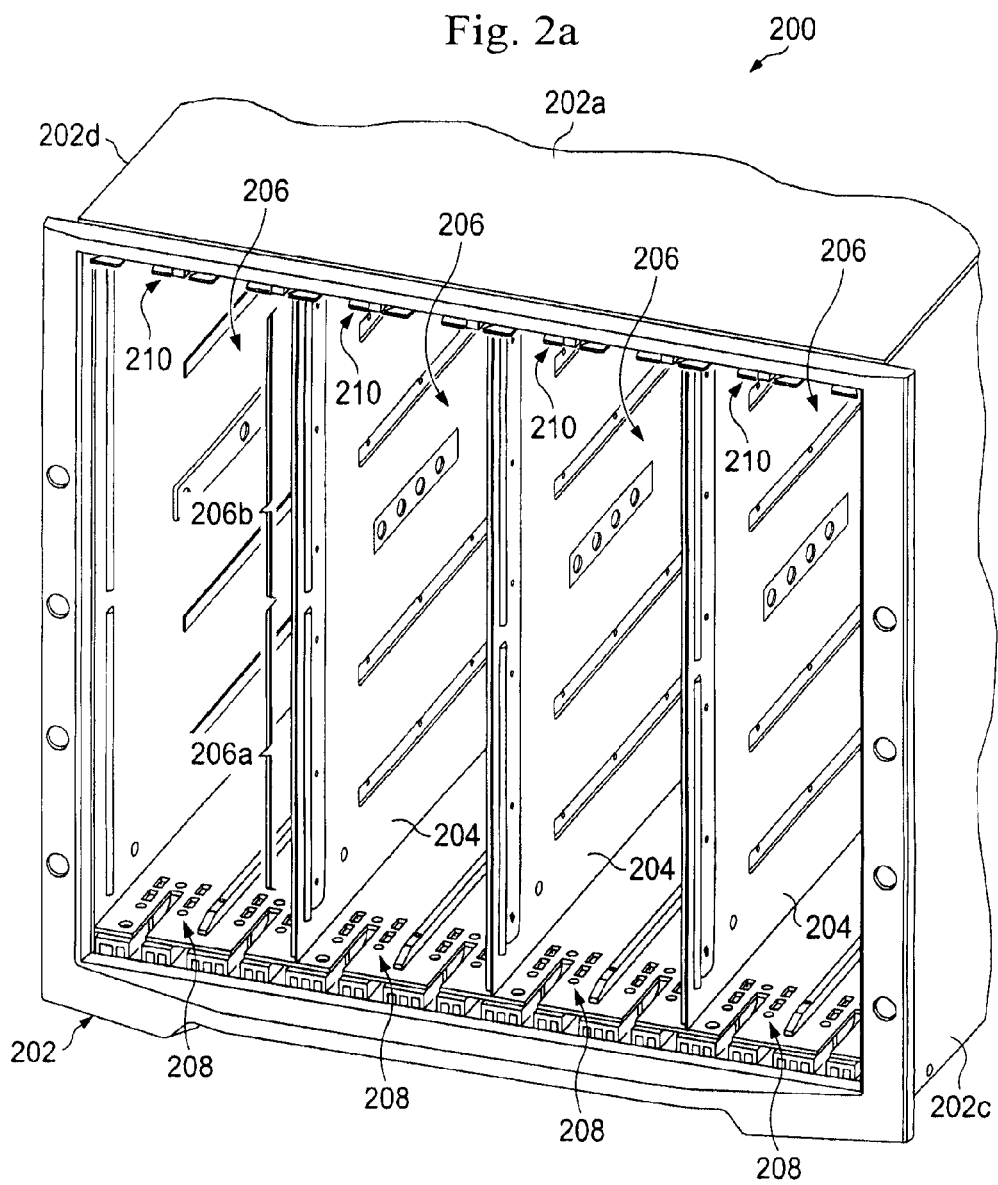
FIG. 2a is a perspective view illustrating an embodiment of a chassis.
Figure 2B:
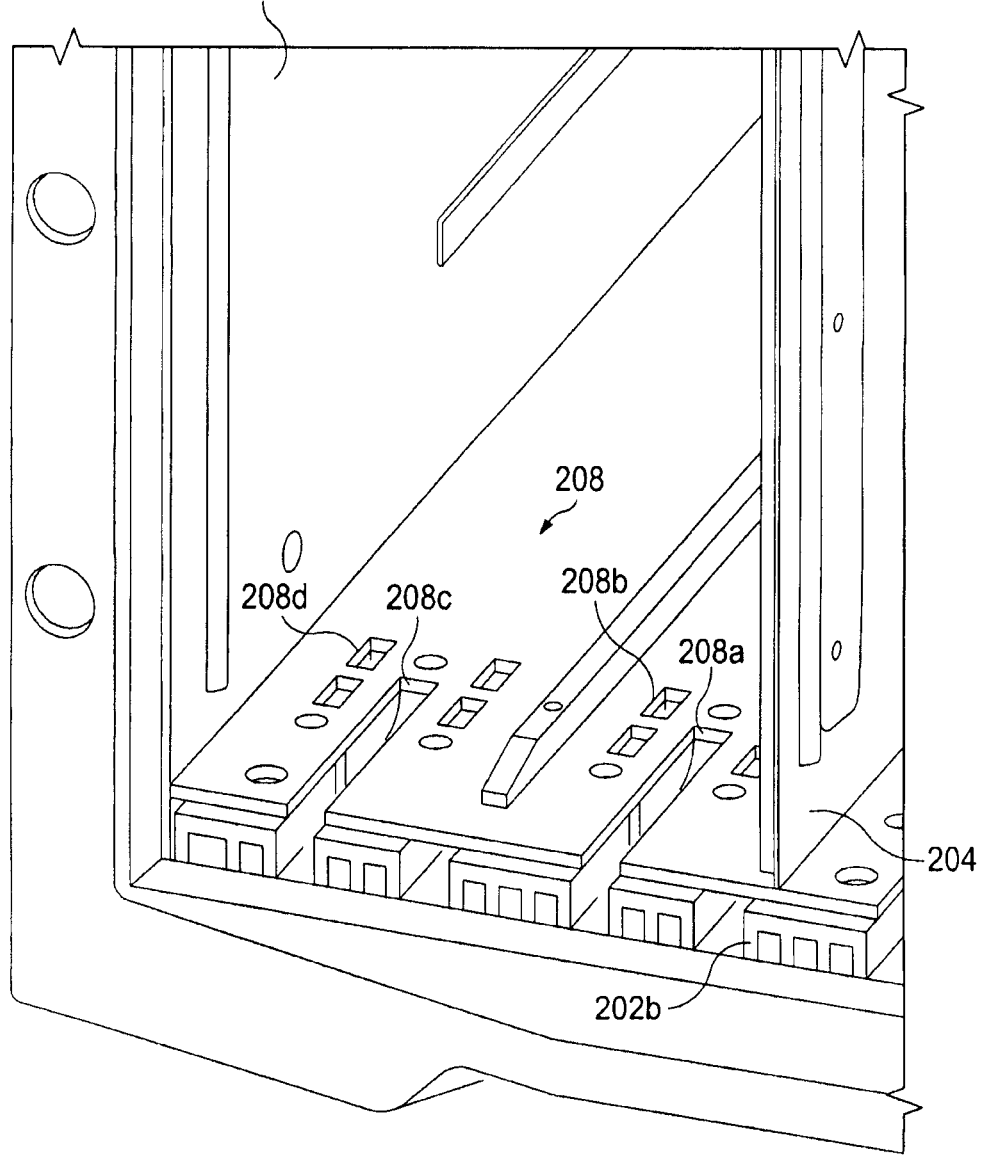

A first component coupling feature 208 is located on the bottom wall 202*b* of the chassis 202 and adjacent each first component section 206*a* of the housings 206, as illustrated in FIGS. 2*a* and 2*b*. The first component coupling feature 208 includes a handle actuating slot 208*a* defined by the bottom wall 202*b*, a securing slot 208*b* defined by the bottom wall 202*b* and located adjacent the handle actuating slot 208*a*, a removal slot 208*c* defined by the bottom wall 202*b*, and a cam force slot 208*d* defined by the bottom wall 202*b* and located adjacent the stop slot 208*c*.

Figure 2C:
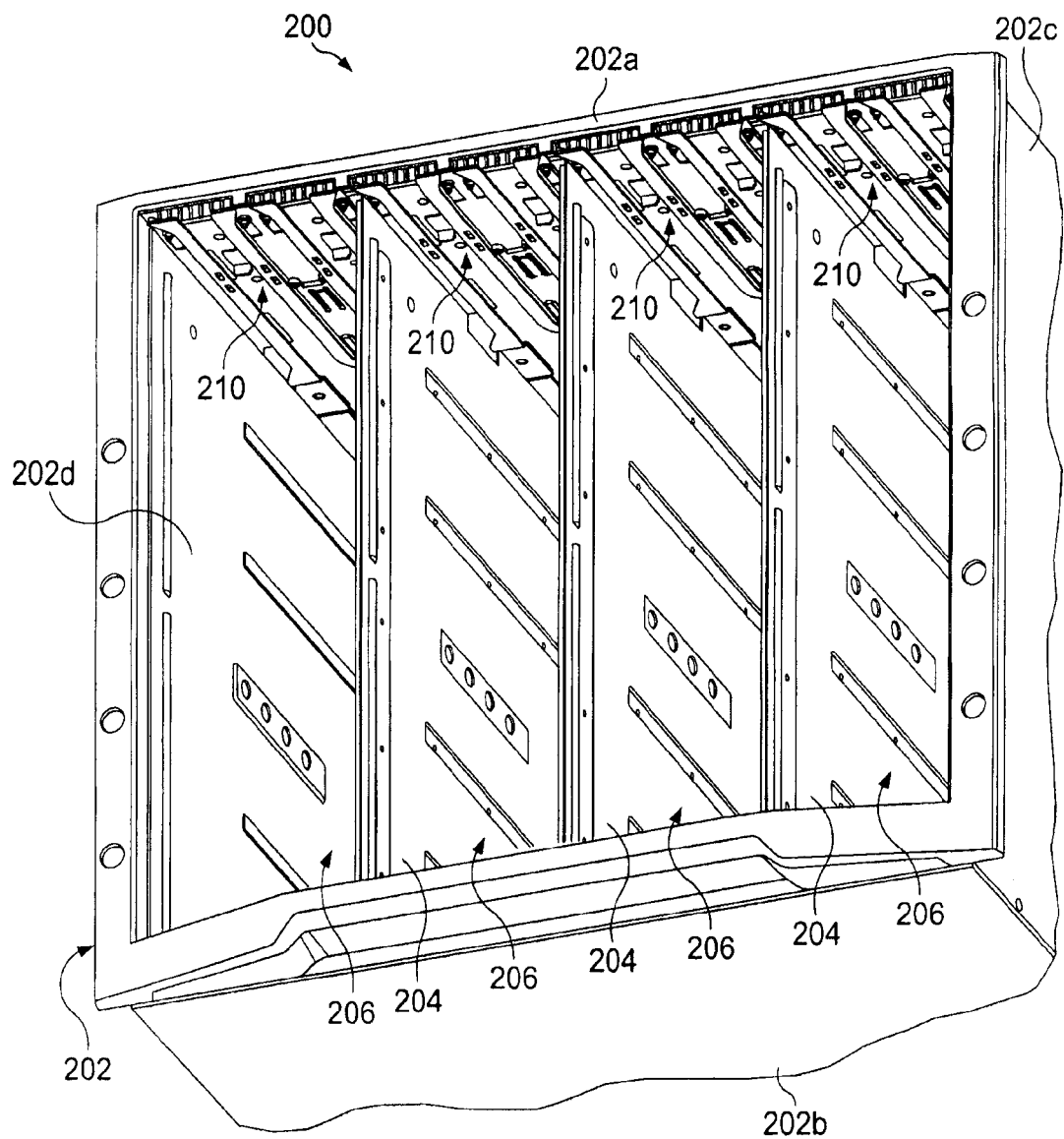
Figure 2D:
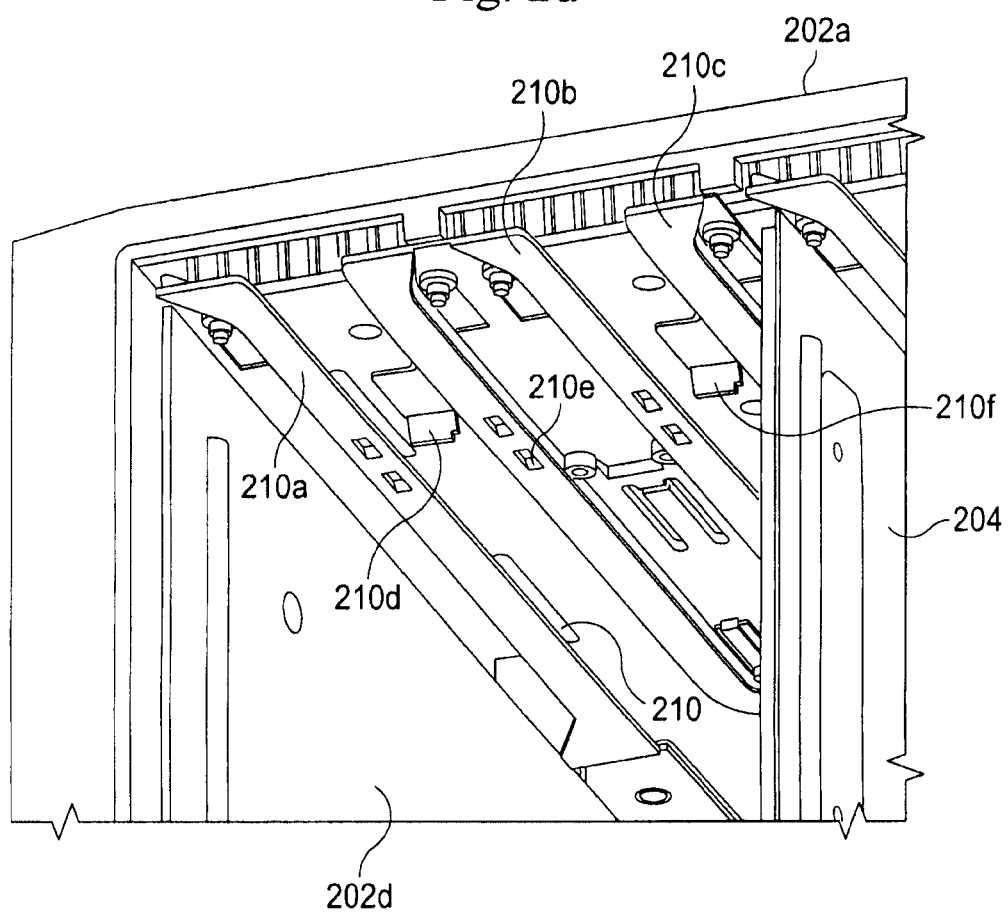
FIG. 2d is a perspective view illustrating an embodiment of a component coupling feature on the chassis of FIG. 2c
Figure 3A:
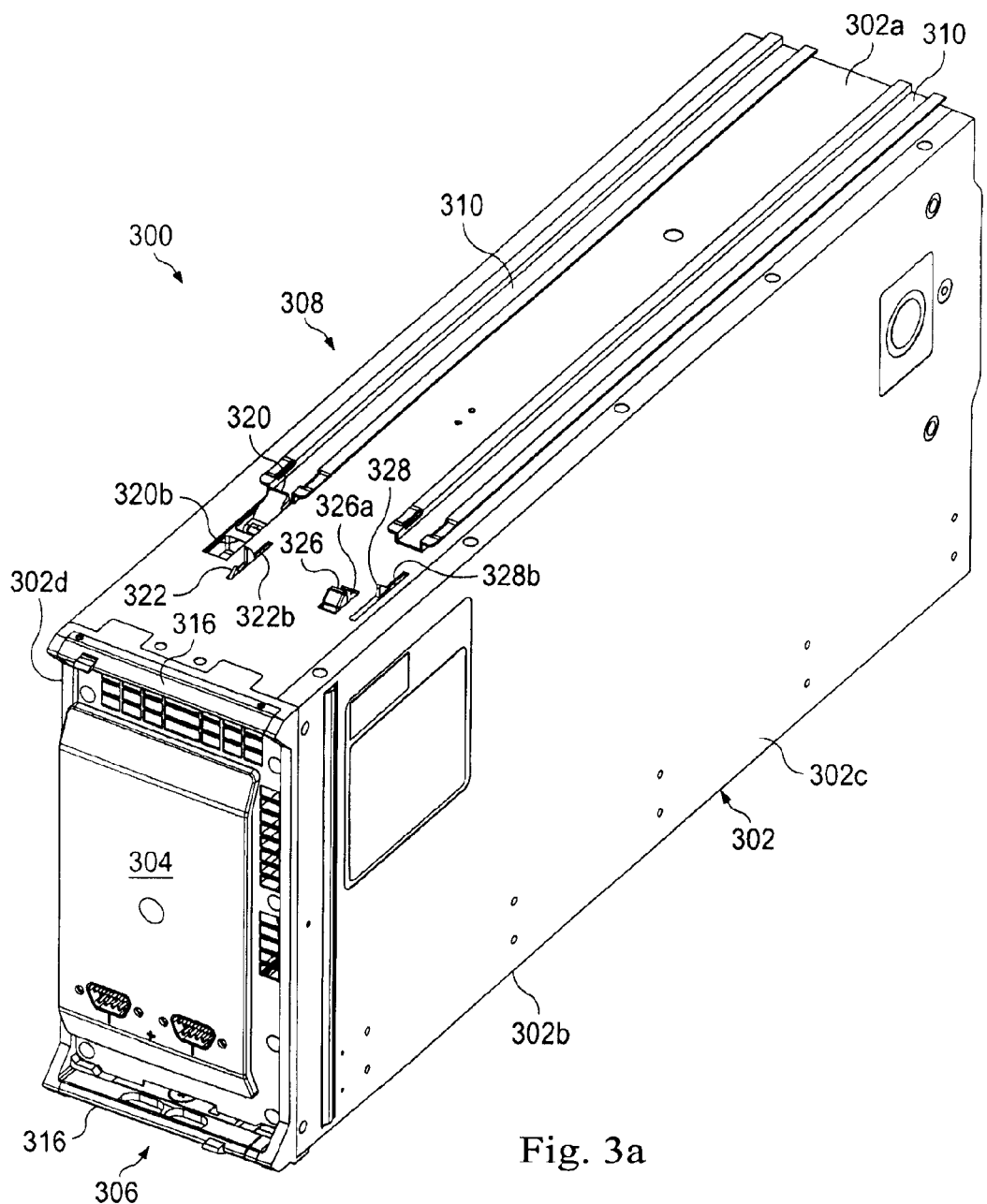
FIG. 3a is a perspective view illustrating an embodiment of an IHS component.
Figure 3B:
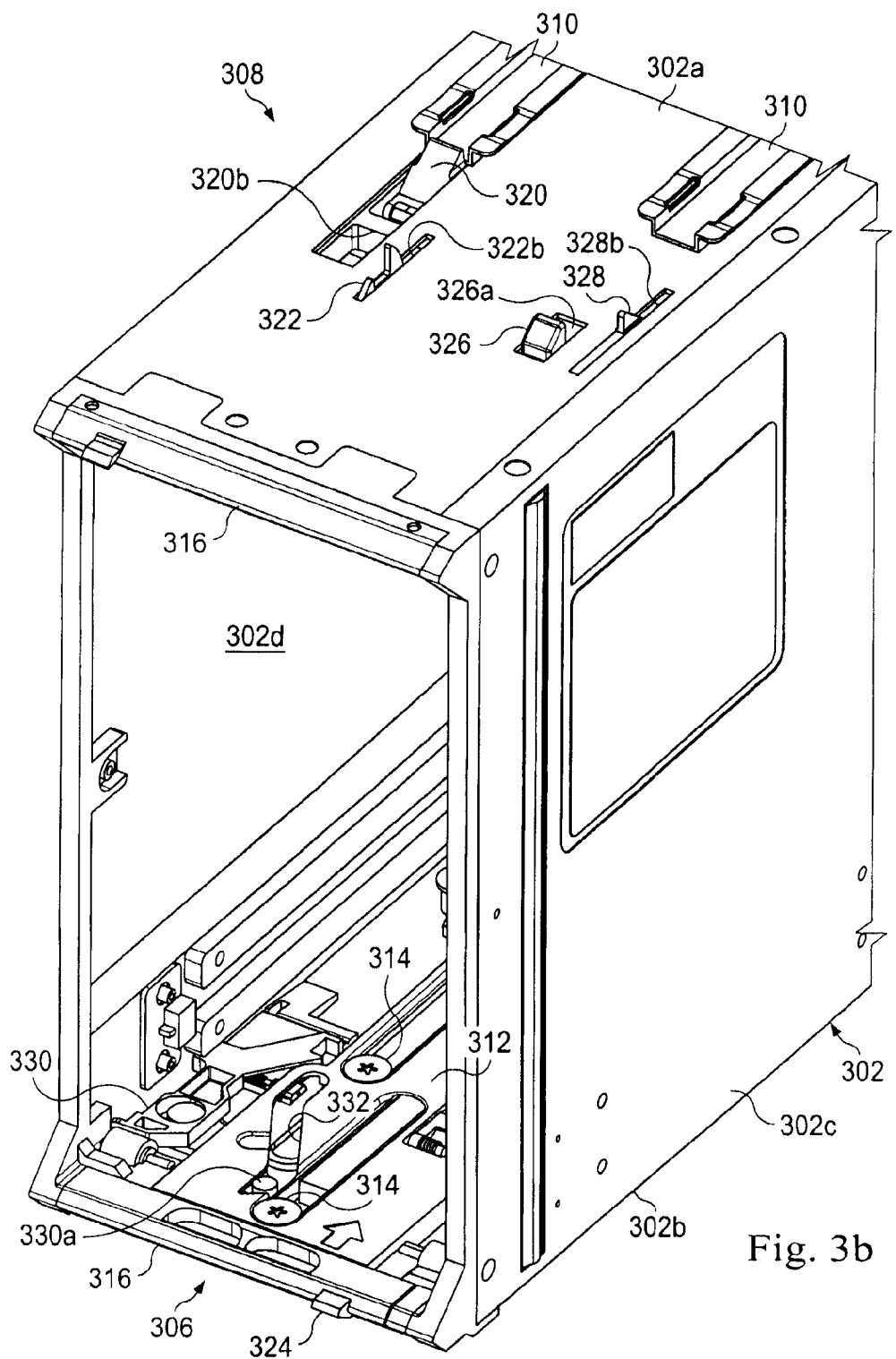
Figure 3C:
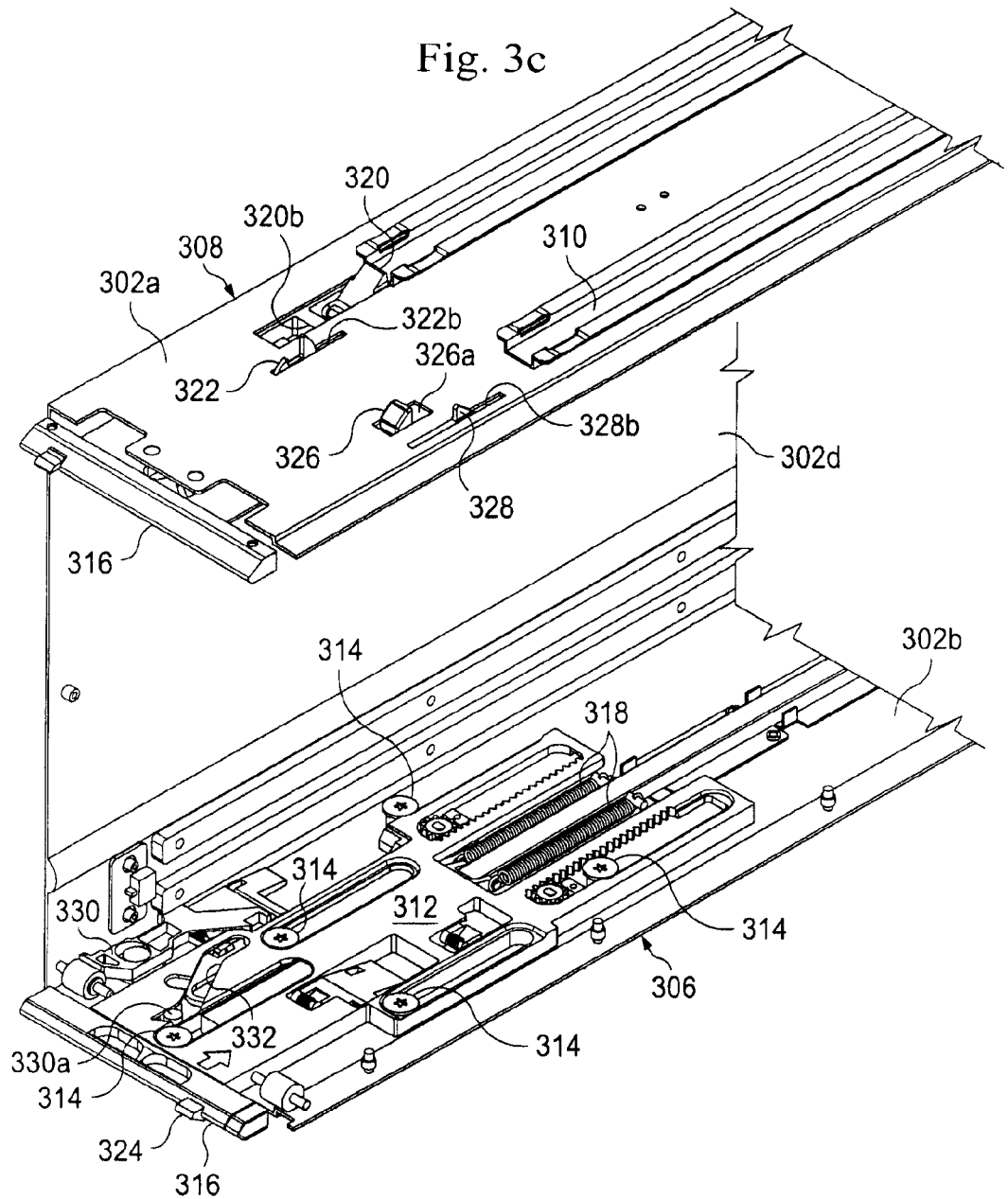

A second component coupling feature 210 is located on the top wall 202*a* of the chassis 202 and adjacent each second component section 206*b* of the housings 206, as illustrated in FIGS. 2*c* and 2*d*. The second component coupling feature 210 includes a plurality of spaced apart guide rails 210*a*, 210*b*, and 210*c* that extend from the top wall 202*a* of the chassis 202*a*. A handle actuating member 210*d* extends from the top wall 202*a* between the guide rails 210*a* and 210*b*. A securing slot 210*e* is defined by the guide rail 210*b* and is located adjacent the handle actuating member 210*d*. A removal member 210*f* extends from the top wall 202*a* between the guide rails 210*b* and 210*c*. A cam force slot (not illustrated) is defined by the guide rail 210*c* and is located adjacent the stop member 210*f*.

Referring now to FIGS. 3*a*, 3*b*, 3*c*, and 3*d*, a modular IHS component 300 is illustrated. The component 300 includes a base 302 having a top wall 302*a*, a bottom wall 302*b* located opposite the base 302 from the top wall 302*a*, and a pair of spaced apart side walls 302*c* and 302*d* extending between the top wall 302*a* and the bottom wall 302*b*. In the illustrated embodiment, a housing is defined between the top wall 302*a*, the bottom wall 302*b*, and the side walls 302*c* and 302*d*, and an IHS 304 is located and secured in the housing using methods know in the art. The IHS 304 includes at least one chassis connector (not illustrated) that extends from the IHS 304 and may include power connectors, data connectors, and/or a variety of other connectors know in the art, and the at least one chassis connector is coupled to IHS components of the IHS 304 such as one or more processors, storage devices, memory devices, and/or a variety of other IHS components known in the art.

The component 300 includes a first chassis coupling feature 306 that is located on the bottom wall 302*b* of the component 300 and a second chassis coupling feature 308 that is located on the top wall 302*a* of the component 300 adjacent a pair of guide rails 310. In the illustrated embodiment, the first chassis coupling feature 306 and the second chassis coupling feature 308 are substantially similar in structure and operation, and thus only the second chassis coupling feature 308 is described in detail below. However, one of skill in the art will recognize that the first and second chassis coupling features may be different or include different elements without departing from the scope of the present disclosure.

The second chassis coupling feature 308 includes a feature base 312 that is moveably coupled to the top wall 202*a* of the chassis 200 through the positioning of a plurality of guide pegs 314 that are coupled to the top wall 202*a* of the chassis 200 in a plurality of guide slots 312*a* defined by the feature base 312. The feature base 312 includes a handle 316. A plurality of resilient members 318 are coupled between the feature base 312 and the chassis 202 in order to resiliently bias the handle 316 into a securing position, discussed in further detail below. A handle actuating member 320 is moveably coupled to the feature base 312 on a biased rotatable coupling 320a such that the handle actuating member 320 is biased to extend through a slot 320b defined by the top wall 302a of the component 300 when the handle 316 is in the securing position. A securing member 322 is moveably coupled to the feature base 312 on a biased rotatable coupling 322a such that the securing member 322 is biased to extend through a slot 322b defined by the top wall 302a of the component 300 when the handle 316 is in the securing position. A securing member release button 324 is coupled to the securing member 322 and operable to move the securing member 322 relative to the feature base 312 about the biased rotatable coupling 322a, as described in further detail below. A removal member 326 extends from a camming feature 330 that is coupled to the feature base 312 and through a slot 326a defined by the top wall 302a of the component 300. A cam force member 328 is moveably coupled to the camming feature 330 on a biased rotatable coupling 328a such that the removal member 328 is biased to extend through a slot 328b defined by the top wall 302a of the component 300 when the handle 316 is in the securing position. The camming feature 330 is moveably coupled to the feature base 312 by a pin member 330a that is positioned in a camming slot 332 defined by the feature base 312. The feature base 312 includes an actuating surface 331.

Referring now to FIGS. 2c, 2d, 3a, 3d, 4a, 4b, 4c, 4d, and 4e, a method 400 for coupling an IHS component to a chassis is illustrated. In the description below, a plurality of IHS components are discussed as each including first chassis coupling features (e.g., the first chassis coupling feature 306) with a first handle (e.g., the handle 316 coupled to the first chassis coupling feature 306) and second chassis coupling features (e.g., the second chassis coupling feature 308) having a second handle (e.g., the handle 316 coupled to the second chassis coupling feature 308) in order to clarify the discussion. However, such distinctions are only meant to be exemplary, and one of skill in the art will recognize that the chassis coupling features on the IHS components may vary from the description below without departing from the scope of the present disclosure.

The method 400 begins at block 402 where a plurality of IHS components and a chassis that defines a plurality of component sections are provided. In an embodiment, the chassis 200 and a plurality of the IHS components 300, described above with reference to FIGS. 2a, 2b, 2c, 2d, 3a, 3b, 3c, and 3d, are provided. The method 400 then proceeds to block 404 where an IHS component is positioned in a second component section of a housing defined by the chassis. The IHS component 300 is positioned in the second component section 206b of the housing 206 defined by the chassis 200 by engaging the guide rails 310 on the top wall 302a of the IHS component 300 with the guide rails 210a, 210b, and 210c adjacent the second component section 206b of one of the housings 206 defined by the chassis 202 and moving the IHS component 300 in a direction A, as illustrated in FIG. 4b.

Figure 4A:
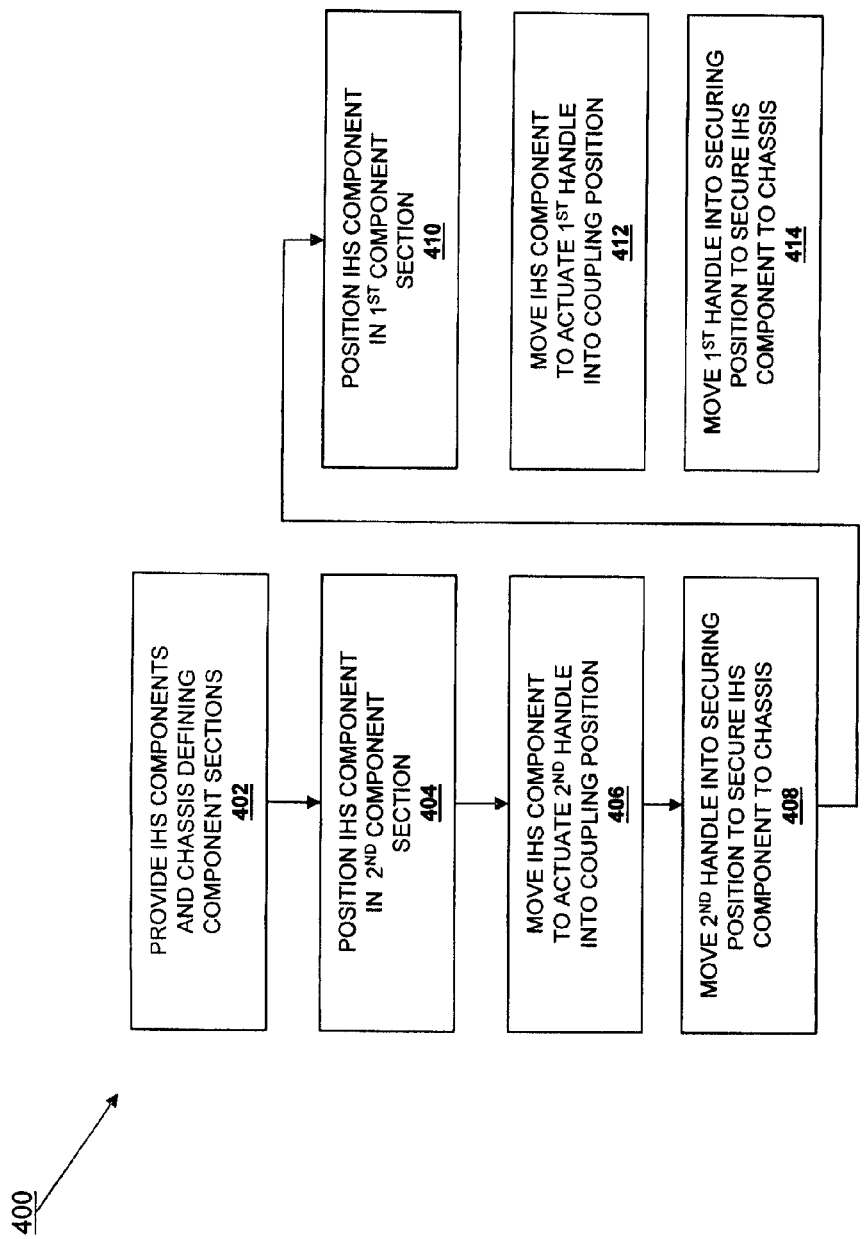
FIG. 4a is a flow chart illustrating an embodiment of a method for coupling an IHS component and a chassis.
Figure 4C:
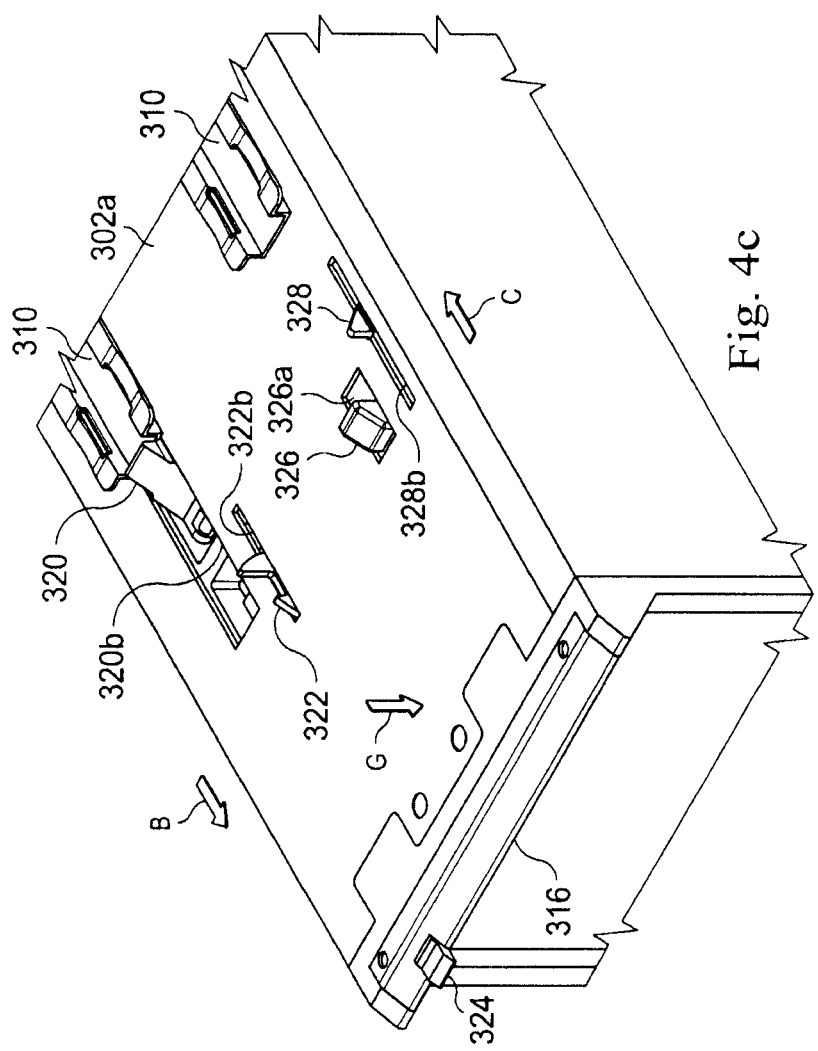
FIG. 4c is a perspective view illustrating an embodiment of the chassis coupling feature on the IHS component of FIG. 4b as the IHS component is moved through the chassis.
Figure 4D:
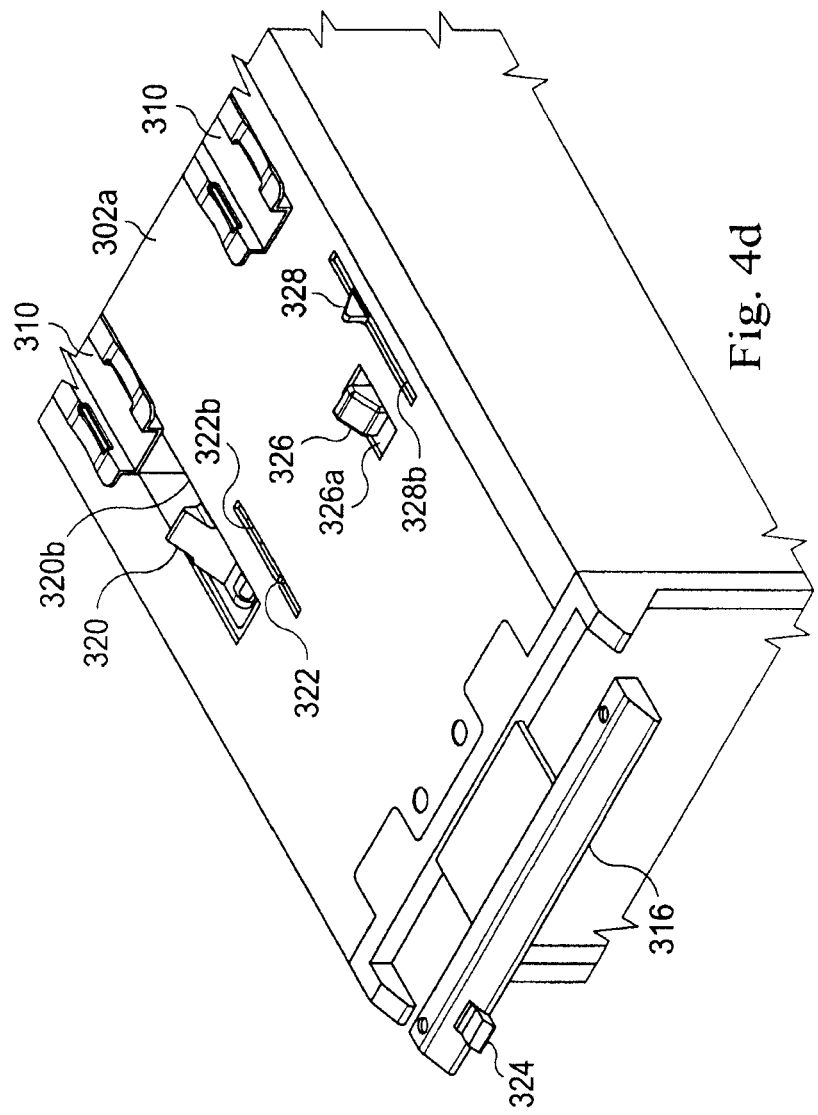
FIG. 4d is a perspective view illustrating an embodiment of the chassis coupling feature on the IHS component of FIG. 4b as the IHS component is moved through the chassis.
Figure 4E:
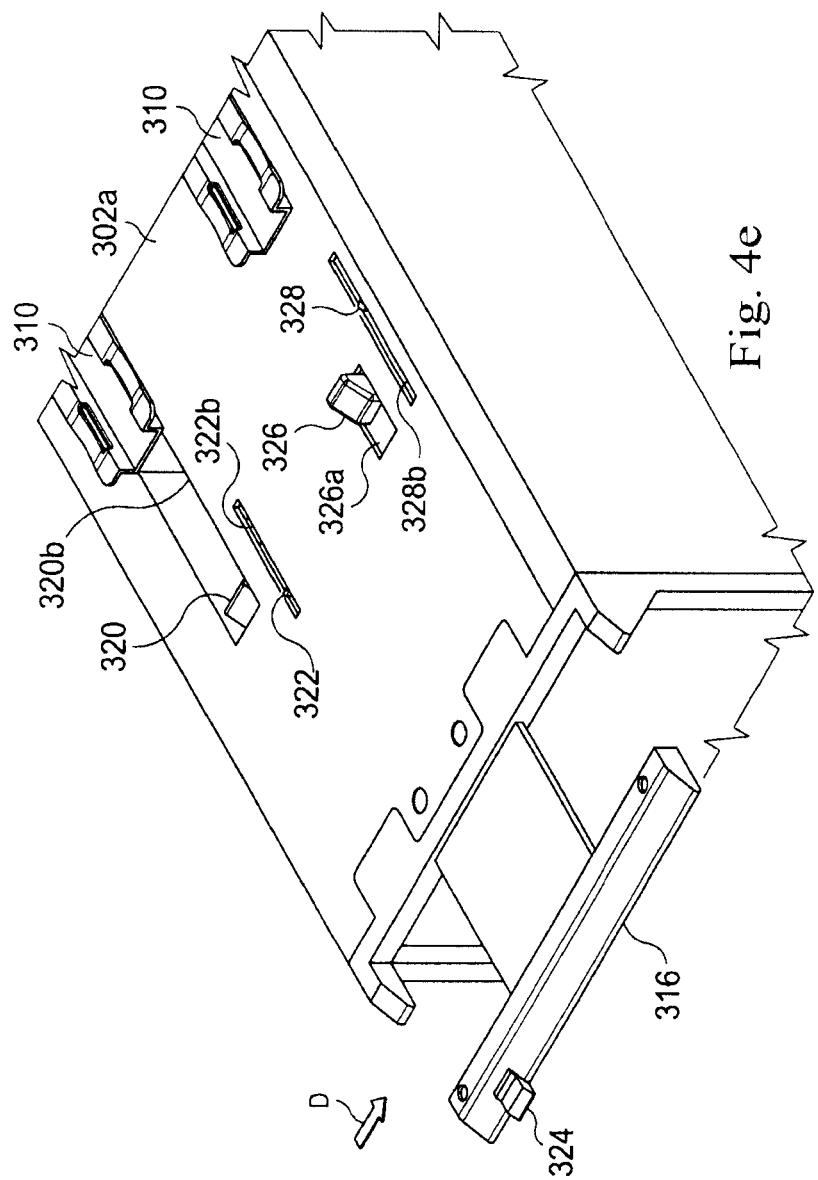
FIG. 4e is a perspective view illustrating an embodiment of the chassis coupling feature on the IHS component of FIG. 4b as the IHS component is moved through the chassis.

The method 400 then proceeds to block 406 where the IHS component is moved relative to the chassis in order to actuate a second handle on the IHS component into a coupling position. As the IHS component 300 continues to move in the direction A illustrated in FIG. 4b, the handle actuating member 210d on the second component coupling feature 210 engages the handle actuating member 320 on the second chassis coupling feature 308 and moves the handle actuating member 320 in a direction B through the slot 320b, as illustrated in FIGS. 4c, 4d, and 4e. Movement of the handle actuating member 320 moves the feature base 312 in the direction B against the biasing force provided by the resilient members 318. As the feature base 312 moves in the direction B, the securing member 322 moves in the direction B and engages the edge of the slot 322a, which causes the securing member 322 to rotate about the biased rotatable coupling 322a such that the securing member 322 moves through the slot 322a and below the top wall 302a of the IHS component 300, as illustrated in FIGS. 4c, 4d, and 4e. As the feature base 312 moves in the direction B, the coupling of the removal member 326 and the cam force member 328 to the feature base 312 causes the removal member 328 and the cam force member 328 to move in a direction C that is opposite the direction B, as illustrated in FIGS. 4c, 4d, and 4e. In an embodiment, the movement of the removal member 326 and the cam force member 328 in the direction C while the feature base 312 moves in the direction B may be accomplished as the pin member 330a moves through the camming slot 332. For example, movement of the pin member 330a through the camming slot 332 may cause rotation of the pin member 330a that then causes linear movement of the camming feature 330 in the direction C due to the coupling of the camming feature 330a and the pin member 330a. Furthermore, movement of the feature base 312 in the direction B and the cam force member 328 in the direction C results in the cam force member 328 engaging the actuating surface 331 on the feature base 312 such that the cam force member 328 rotates about the biased rotatable coupling 328a and moves through the slot 328b and below the top wall 302a of the IHS component 300, as illustrated in FIGS. 4c, 4d, and 4e.

As can be seen in FIGS. 4c, 4d, 4e, and 4f, the engagement of the second chassis coupling feature 308 on the IHS component 300 and the second component coupling feature 210 on the chassis 200 causes the second handle 316 that is coupled to the second chassis coupling feature 308 to move into a coupling position D in which the second handle extends form the IHS component 300. As illustrated in FIG. 4e, movement of the handle actuating member 320 through the slot 320b causes the handle actuating member 320 to engage the edge of the slot 320b and rotate about the biased rotatable coupling 320a such that the handle actuating member 320 moves through the slot 320b and below the top wall 302a of the IHS component 300. Movement of the handle actuating member 320, the securing member 322, and the cam force member 328 below the top wall 302a results in the engagement of the removal member 326 on the second chassis coupling feature 308 and the removal member 210f on the second component coupling feature 210 to prevent further movement of the IHS component 300 relative to the chassis 200 in the direction A, and allows the IHS component 300 to become positioned in the chassis 200 such that the slot 328b is located adjacent the second securing slot (not illustrated) defined by the guide rail 210c and the slot 322 is located adjacent the first securing slot 210e is defined by the guide rail 210b.

The method 400 then proceeds to block 408 where the second handle on the IHS component is moved into a securing position to secure the IHS component to the chassis. As can be seen in FIG. 4f, once the IHS component 300 has been positioned in the chassis 200 to move the second handle 316 into the coupling position D, the second handle 316 extends from the IHS component 300 and the chassis 200, which helps provide an indication to a user that the extended second handle 316 is the "active handle" to be used to secure the IHS component 300 to the chassis 200. The user may then move the second handle 316 in a direction E. Movement of the second handle 316 in the direction E causes the feature base 312 to move in the direction E, which results in the cam force member 328 disengaging the actuating surface 331 on the feature base 312 and the biased rotatable coupling 328a causing the cam force member 238 to extend back through the slot 328b (as illustrated in FIG. 4d) and into the second securing slot (not illustrated) defined by the guide rail 210c, Further movement of the second handle 316 and the feature base 312 in the direction E moves the cam force member 328 in the direction B, illustrated in FIG. 4c, and though the engagement of the cam force member 328 and the guide rail 210c, causes the IHS component 300 to move relative to the chassis 200 in the direction A, illustrated in FIG. 4b. The second handle 316 is moved in the direction E until it reaches a securing position F, illustrated in FIG. 4g. In the securing position F, the biased rotatable coupling 322a causes the securing member 322 to move back through the slot 322a and into the slot 210e defined by the guide rail 210b. During the movement of the second handle 316 from the coupling position D to the securing position F, the camming feature 330 produces a mechanical assist between the cam force member 328 and the guide rail 210c that provides a force that is sufficient to mate the at least one chassis connector on the IHS component 300 and the at least one IHS connection on the chassis 200. Furthermore, with the second handle 316 in the securing position F, the engagement of the securing member 322 with the guide rail 210b secures the IHS component 300 in the second component section 206b of the housing 206 defined by the chassis 200 as long as the second handle 316 is in the securing position D. As can be seen from in FIGS. 4b, 4f, and 4g, the coupling and securing of the IHS component 300 to the chassis 200 in the second component section 206b results in the first chassis coupling feature 306 being positioned adjacent the first component section 206a and not engaging the chassis 200.

Figure 4H:
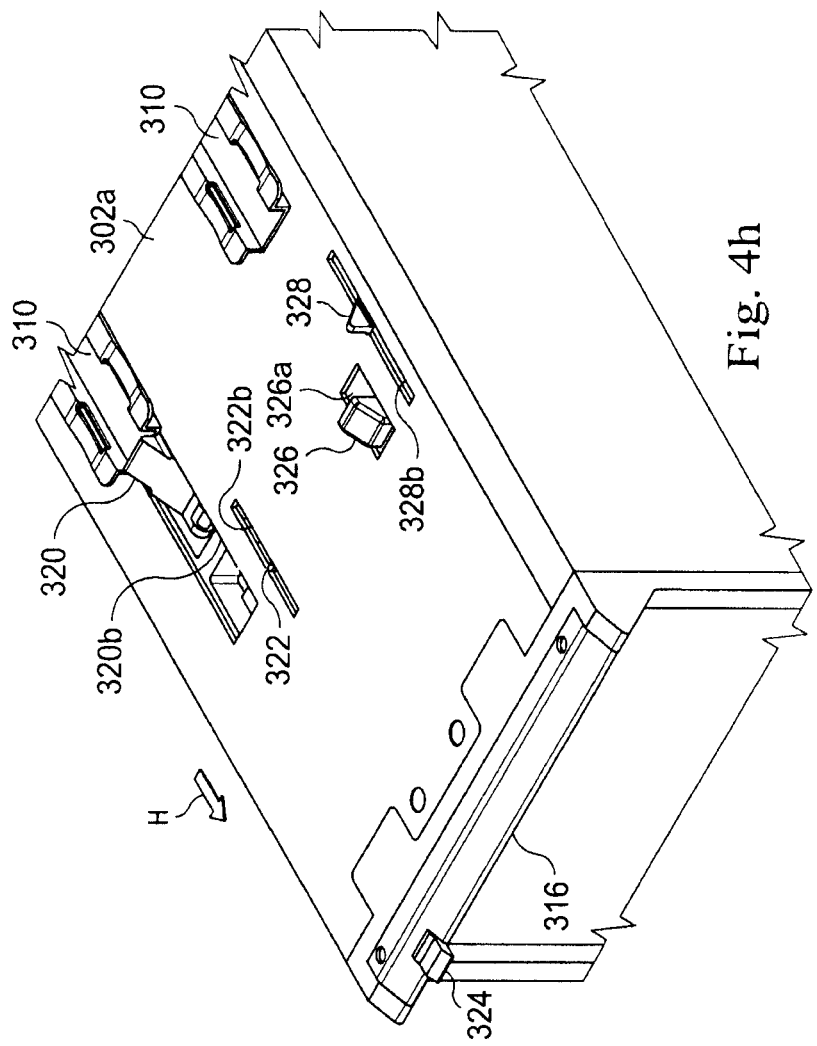
FIG. 4h is a perspective view illustrating an embodiment of the chassis coupling feature on the IHS component of FIG. 4g being actuated to release the handle from the securing position.

In order to remove the IHS component 300 from the second component section 206b of the housing 206 defined by the chassis 200, the user may depress the securing member release button 324 to move the securing member 322 in a direction G from the position illustrated in FIG. 4c to the position illustrated in FIG. 4h such that the securing member 322 is no longer located in the securing slot 210e that is defined by the guide rail 210b. With the securing member 322 is no longer located in the securing slot 210e, the second handle 316 may be moved in a direction H, illustrated in FIGS. 4b, 4d, and 4e, to cause the removal member 326 and the cam force member 328 to move in the direction C, illustrated in FIG. 4c, such that the removal member 328, through its engagement with the removal member 210f, provides a force to move the IHS component 300 out of the second component section 206b in the housing 206 defined by the chassis 200, and the cam force member 328 engages the actuating surface 331 on the feature base 312 to rotate about the biased rotatable coupling 328a and move through the slot 328b and below the top wall 302a of the IHS component 300, as illustrated in FIG. 4e. The IHS component 300 may then be completely removed from the second component section 206b of the housing 206 defined by the chassis 202.

Figure 4J:
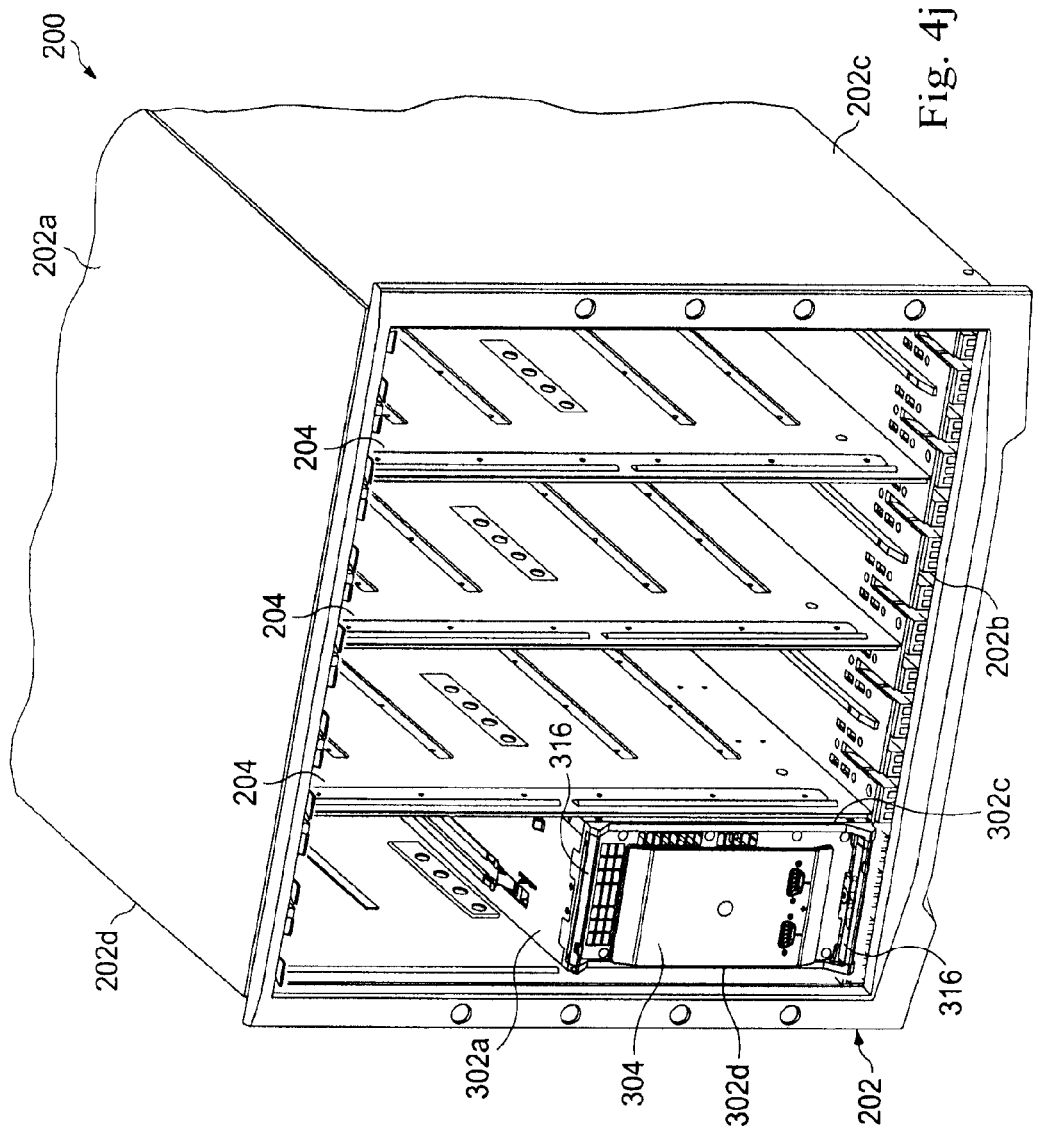
FIG. 4*j* is a perspective view illustrating an embodiment of the IHS component of FIG. 4*i* secured in a first component section defined by the chassis.

The method 400 then proceeds to blocks 410, 412, and 414 where an IHS component is positioned in a first component section of the chassis, moved to actuate a first handle into a coupling position, illustrated in FIG. 4i, and then that first handle moved into a securing position to secure the IHS component to the chassis, illustrated in FIG. 4j. In an embodiment, blocks 410, 412, and 414 of the method 400 are substantially similar to block 404, 406, and 408 of the method 400, with the provision of the engagement of the first chassis coupling feature 306 on the IHS component 300 and the first component coupling feature 208 on the chassis 200 to actuate the first handle 316 that is coupled to the first chassis coupling feature 306 into the coupling position, and then the movement of that first handle 316 into the securing position to secure the IHS component in the first component section 206a of the housing 206. One of skill in the art will recognize how the handle actuating slot 208a, the securing slot 208b, the removal slot 208c, and the cam force slot 208d may be engaged by the handle actuating member 320, the securing member 322, the removal member 326, and the cam force member 328, respectively, of the first chassis coupling feature 306 to provide the same functionality as discussed above for the second component coupling feature 210 and the second chassis coupling feature 306. As can be seen from in FIGS. 4i and 4j, the coupling and securing of the IHS component 300 to the chassis 200 in the first component section 206a results in the second chassis coupling feature 308 being positioned adjacent the second component section 206b and not engaging the chassis 200.

Thus, a chassis and IHS component are provided that allow the IHS component to be coupled to the chassis in a plurality of different component coupling sections that include component coupling features that have different boundaries and that engage the IHS component at different locations. The IHS component includes a plurality of chassis coupling features that operate independently of each other and engage the component coupling features on the chassis to indicate to a user which chassis coupling feature must be actuated to secure the IHS component to the chassis.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A modular component chassis coupling system, comprising: a chassis defining a housing and including a first component coupling feature located adjacent a first component section in the housing and a second component coupling feature located adjacent a second component section in the housing, wherein the first component section is located immediately adjacent the second component section and the first component coupling feature is located opposite the housing from the second component coupling feature; a modular component having a first side including a first chassis coupling feature and a second side having a second chassis coupling feature, wherein the first chassis coupling feature is located opposite the modular component from the second chassis coupling feature; a first handle coupled to the first chassis coupling feature, wherein in response to the modular component being positioned in the first component section, the first chassis coupling feature engages the first component coupling feature to move the first handle relative to the modular component and into a coupling position while the second chassis coupling feature is located adjacent the second component section and does not engage the chassis, and wherein the first handle is operable, once in the coupling position, to be moved into a securing position to secure the modular component in the first component section; and a second handle coupled to the second chassis coupling feature, wherein in response to the modular component being positioned in the second component section, the second chassis coupling feature engages the second component coupling feature to move the second handle relative to the modular component and into a coupling position while the first chassis coupling feature is located adjacent the first component section and does not engage the chassis, and wherein the second handle is operable, once in the coupling position, to be moved into a securing position to secure the modular component in the second component section.

2. The system of claim 1, wherein movement of the first handle from the coupling position to the securing position activates a camming feature between the first chassis coupling feature and the first component coupling feature.

3. The system of claim 1, wherein movement of the second handle from the coupling position to the securing position activates a camming feature between the second chassis coupling feature and the second component coupling feature.

4. The system of claim 1, wherein each of the first handle and the second handle are biased into the securing position.

5. The system of claim 1, wherein the first handle and the second handle are each operable to move into their respective coupling positions independently of each other.

6. An information handling system (IHS), comprising: a chassis defining a housing and including a first component coupling feature located adjacent a first component section in the housing, a second component coupling feature located adjacent a second component section in the housing, and at least one IHS connector located adjacent each of the first component section and the second component section, wherein the first component section is located immediately adjacent the second component section and the first component coupling feature is located opposite the housing from the second component coupling feature; an IHS component having a first side including a first chassis coupling feature, a second side having a second chassis coupling feature, and including a processor that is coupled to at least one chassis connector that extends from the IHS component, wherein the first chassis coupling feature is located opposite the IHS component from the second chassis coupling feature; a first handle coupled to the first chassis coupling feature, wherein in response to the IHS component being positioned in the first component section, the first chassis coupling feature engages the first component coupling feature to move the first handle relative to the IHS component and into a coupling position while the second chassis coupling feature is located adjacent the second component section and does not engage the chassis, and wherein the first handle is operable, once in the coupling position, to be moved into a securing position to secure the IHS component in the first component section and mate the at least one chassis connector and the at least one IHS connector adjacent the first component section; and a second handle coupled to the second chassis coupling feature, wherein in response to the IHS component being positioned in the second component section, the second chassis coupling feature engages the second component coupling feature to move the second handle relative to the IHS component and into a coupling position while the first chassis coupling feature is located adjacent the first component section and does not engage the chassis, and wherein the second handle is operable, once in the coupling position, to be moved into a securing position to secure the IHS component in the second component section and mate the at least one chassis connector and the at least one IHS connector adjacent the second component section.

7. The system of claim 6, wherein movement of the first handle from the coupling position to the securing position activates a camming feature between the first chassis coupling feature and the first component coupling feature.

8. The system of claim 6, wherein movement of the second handle from the coupling position to the securing position activates a camming feature between the second chassis coupling feature and the second component coupling feature.

9. The system of claim 6, wherein each of the first handle and the second handle are biased into the securing position.

10. The system of claim 6, wherein the first handle and the second handle are each operable to move into their respective coupling positions independently of each other.

11. The system of claim 6, wherein the IHS component includes at least one storage device coupled to the processor.

12. A method for coupling an IHS component to a chassis, comprising: providing a plurality of IHS components each having a first side including a first chassis coupling feature, a second side located opposite that IHS component from the first side and having a second chassis coupling feature, and including a processor that is coupled to at least one chassis connector that extends from that IHS component; positioning a first IHS component of the plurality of IHS components in a first component section of a housing defined by a chassis, wherein the housing defined by the chassis includes a second component section that is located immediately adjacent the first component section; engaging the first chassis coupling feature on the first IHS component with a first component coupling feature on the chassis to move a first handle that is coupled to the first chassis coupling feature relative to the first IHS component and into a coupling position while the second chassis coupling feature on the first IHS component is located adjacent the second component section of the housing and does not engage the chassis; moving the first handle from the coupling position into a securing position to secure the first IHS component in the first component section and mate the at least one chassis connector on the first IHS component with a first IHS connector on the chassis; positioning a second IHS component of the plurality of IHS components in the second component section of the housing defined by the chassis; engaging the second chassis coupling feature on the second IHS component with a second component coupling feature on the chassis that is located opposite the housing from the first component coupling feature, wherein the engagement of the second chassis coupling feature and the second component coupling feature moves a second handle that is coupled to the second chassis coupling feature relative to the second IHS component and into a coupling position while the first chassis coupling feature on the second IHS component is located adjacent the first component section and does not engage the chassis; and moving the second handle from the coupling position into a securing position to secure the second IHS component in the second component section and mate the at least one chassis connector on the second IHS component with a second IHS connector on the chassis.

13. The method of claim 12, wherein the moving the first handle from the coupling position to the securing position activates a camming feature between the first chassis coupling feature on the first IHS component and the first component coupling feature on the chassis.

14. The method of claim 12, wherein the moving the second handle from the coupling position to the securing position activates a camming feature between the second chassis coupling feature on the second IHS component and the second component coupling feature on the chassis.

* * * * *